United States Patent
Nakano

[11] Patent Number: 5,524,654
[45] Date of Patent: Jun. 11, 1996

[54] ETCHING, DEVELOPING AND PEELING APPARATUS FOR PRINTED BOARD

[75] Inventor: Teruyuki Nakano, Fukuyama, Japan

[73] Assignee: Kabushi Gaisha Ishii Hyoki, Hiroshima, Japan

[21] Appl. No.: 394,324

[22] Filed: Feb. 23, 1995

Related U.S. Application Data

[63] Continuation of Ser. No. 182,948, Jan. 13, 1994, abandoned.
[51] Int. Cl.⁶ .......................................... B08B 3/02
[52] U.S. Cl. .................... 134/131; 134/153; 134/181; 134/902; 239/596; 239/592; 239/558
[58] Field of Search ............... 134/64 R, 122 R, 134/153, 181, 902, 199, 176, 179, 180, 129, 130, 131; 239/127.1, 127.3, 596, 592, 593, 594, 595, 558

[56] References Cited

U.S. PATENT DOCUMENTS

| | | | |
|---|---|---|---|
| 3,510,352 | 5/1970 | Neuman | 134/181 |
| 5,002,616 | 3/1991 | Ketelhom | 134/130 |
| 5,129,956 | 7/1992 | Pickering et al. | 134/129 |
| 5,387,313 | 2/1995 | Thoms | 174/129 |

*Primary Examiner*—Frankie L. Stinson
*Attorney, Agent, or Firm*—Lane, Aitken & McCann

[57] ABSTRACT

An etching, developing and peeling apparatus for a printed board includes a vertical disk having a center part fixed with a lower end of a vertical shaft driven and rotated at an elected speed, and a lower face of the disk dotted with nozzles for jetting chemicals in a downward vertical direction.

2 Claims, 3 Drawing Sheets

ETCHING, DEVELOPING AND PEELING APPARATUS FOR PRINTED BOARD

CROSS REFERENCE TO RELATED APPLICATION

This is a continuation of Ser. No. 08/182,948, filed on Jan. 13, 1994 now abandoned.

BACKGROUND OF THE INVENTION

1. Field of the Invention

The present invention relates to an apparatus for etching, developing and peeling a printed board.

2. Description of the Related Art

An apparatus for etching, developing and peeling a printed board is already known. For instance, an apparatus shown in FIG. 3 comprises a roller conveyer device 1 for carrying a printed board "w" in a horizontal posture, and a nozzle tube device 2 for jetting chemicals to an upper surface of the printed board "w" conveyed by the conveyer device 1. Here, the nozzle tube device 2 is rockable along a center line of the tube.

In this device, the efficacy of etching process, etc. is changed by changing the feeding speed of the conveyer device 1 so as to change the travelling speed of the printed board "w".

In the above-mentioned conventional device, the feeding speed is lowered if the processing efficacy is to be heightened by having enough chemical jetting. Accordingly, the throughput per hour goes down, and the cost goes up. Besides, when the nozzle tube device is rocked, an angle of inclination of chemicals jetted from the nozzle for the vertical direction is increased, thereby causing a furrow "p" (side etching) in a vertical wall formed by etching process, as shown in FIG. 3(b).

SUMMARY OF THE INVENTION

It is, therefore, an object of this invention to provide an etching, developing and peeling device for a printed board which can settle the above problems.

To solve the above problems, the present invention is characterized by an etching, developing and peeling apparatus for a printed board, wherein a center part of a vertical disk is fixed with a lower end of a vertical shaft driven and rotated at an elected speed, and a lower face of the disk is dotted with nozzles for jetting chemicals in a downward vertical direction.

In the present invention, the efficacy of the process is heightened by speeding up the rotation of the vertical shaft so as to increase the rotating speed of the disk. Accordingly, the amount of chemicals jetted from the nozzles to the printed board per hour increases, thereby effecting the increase of the processing efficacy. Besides, since chemicals are always jetted from the nozzles in a downward vertical direction in spite of the rotating speed of the disk, side etching hardly occurs.

According to the device of the present invention, the processing efficacy can be heightened without lowering the feeding speed of a printed board, thereby reducing the cost of products. Besides, since chemicals from the nozzles are always jetted in a downward vertical direction in spite of the rotating speed of the disk, side etching hardly occurs. Moreover, the rotating direction of the nozzles for the printed board becomes opposite in the front and back of the printed board travelling direction on the roller conveyer device, thereby effecting uniform and minute etching. Furthermore, since the disk is rotating, chemicals jetted to the surface of the printed board is easily removed to the outside, thereby effecting further equal etching treatment.

DETAILED DESCRIPTION OF PREFERRED EMBODIMENT

Figure 1A:
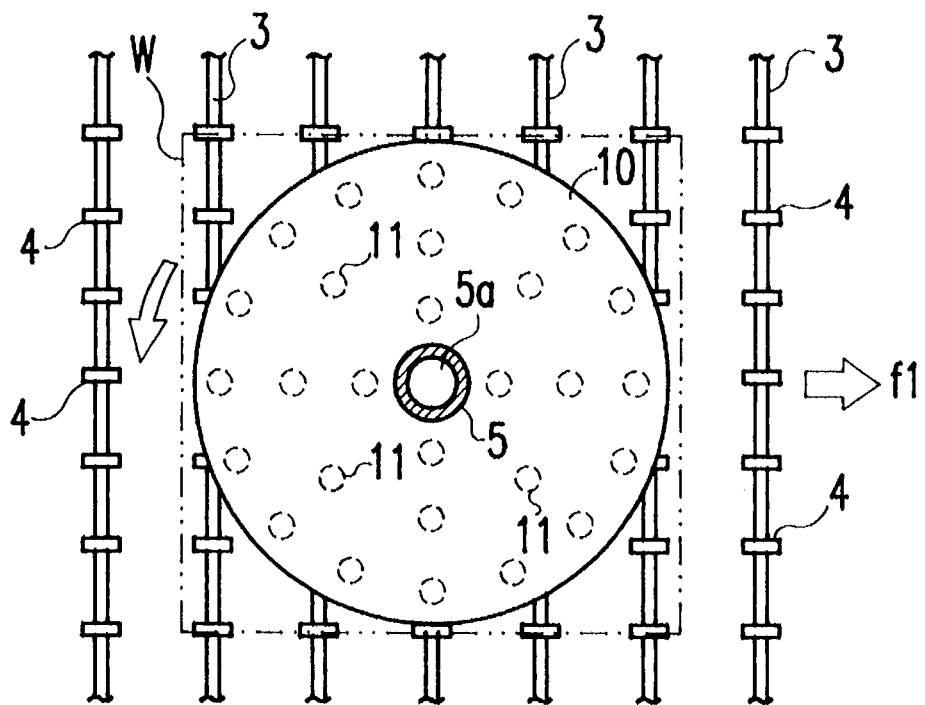
FIG. 1(a) is a plan view of a device according to the present invention.
Figure 1B:
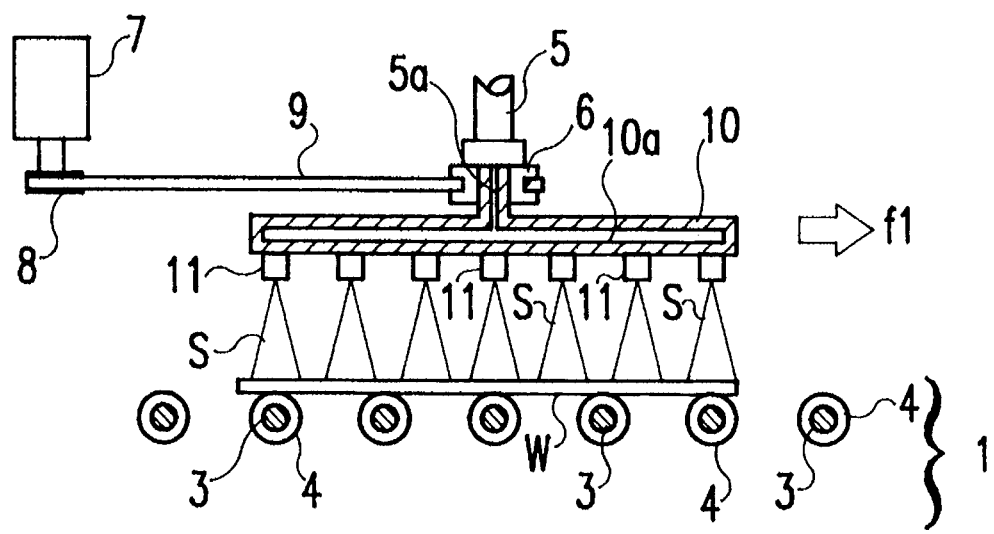
FIG. 1(b) is a side elevational view of a device according to the present invention.
Figure 2:
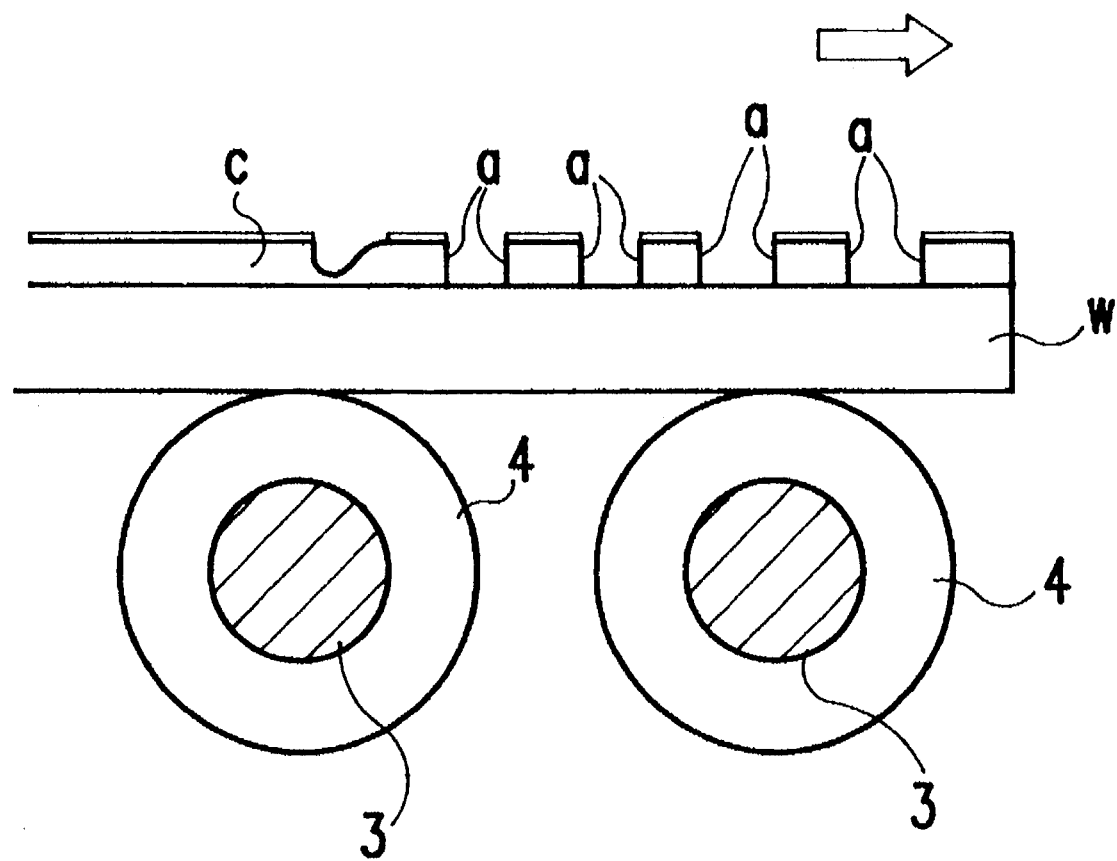
FIG. 2 is a side elevational view of a printed board to be treated in the above device and its circumference.
Figure 3A:
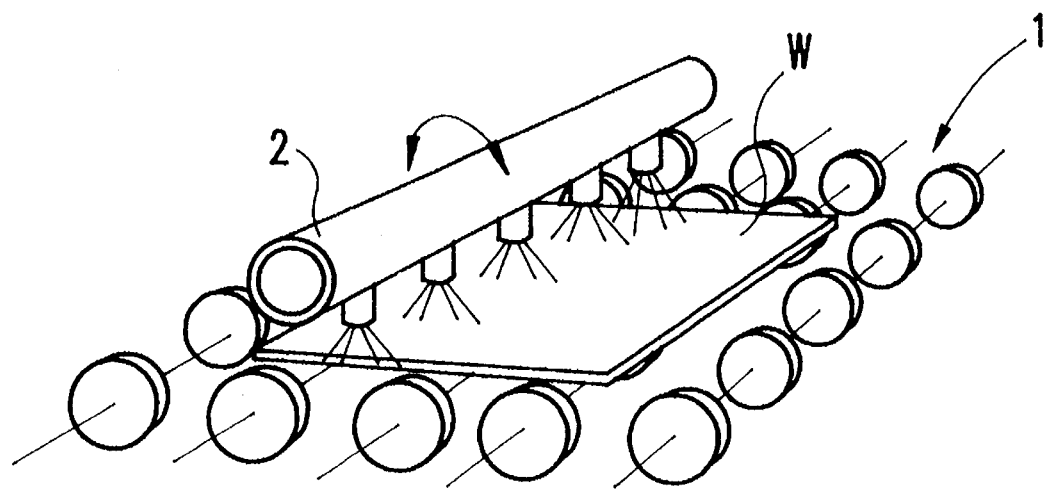
FIG. 3(a) is a perspective view of a conventional example.
Figure 3B:
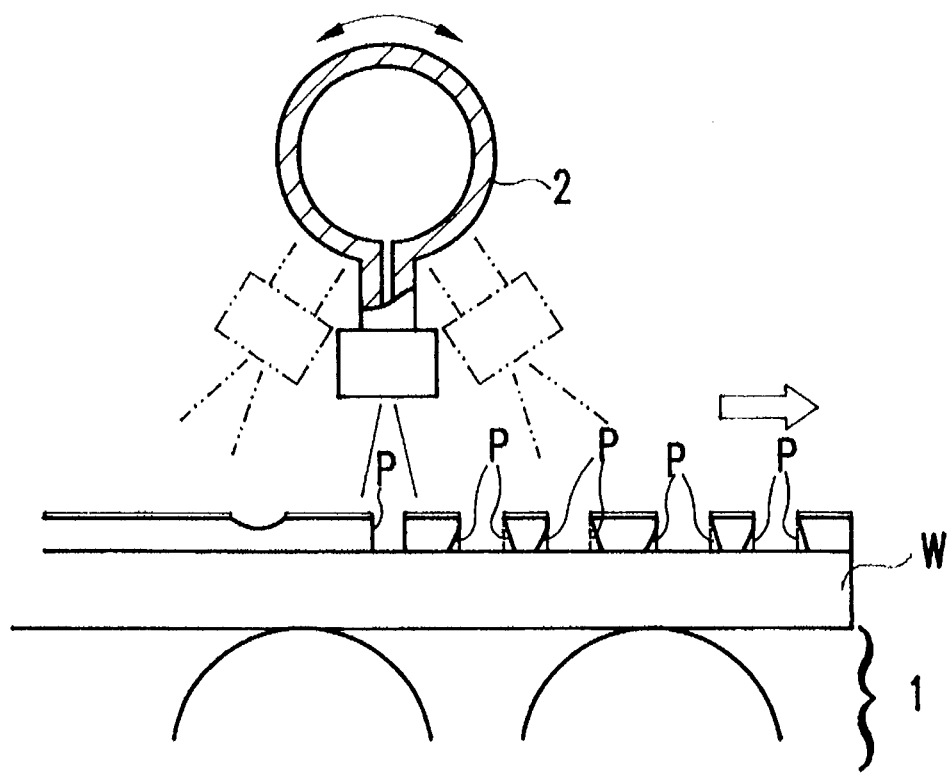
FIG. 3(b) is an enlarged side elevational view of a conventional example.

The embodiment of the present invention is now explained with reference to FIGS. 1(a), 1(b) and 2. A roller conveyer device 1 for carrying a printed board "w" in a horizontal posture is the same as the conventional roller conveyer device, wherein shafts 3 rotated by means of a suitable driving mechanism are juxtaposed, rubber rollers 4 are provided and ranked to each shaft 3, and the rotating speed of each shaft 3 can be changed and adjusted according to necessity.

A vertical shaft 5 is provided above the roller conveyer device 1 by means of not-illustrated shaft bearings so as to be rotatable at a fixed height. A liquid passage 5a is formed in the center of the vertical shaft 5, and chemicals "s" are provided therein from above by means of a not-illustrated rotary joint, etc. with suitable pressure.

Reference number 6 is a pulley fixed to the vertical shaft 5. Reference number 7 is a motor whose rotating speed can be electively changed, and a pulley 8 is fixed to its output axis. A transmission belt 9 is set between these two pulleys 6 and 8.

Reference number 10 is a horizontal disk having a hollow 10a. A center part of the horizontal disk 10 is fixed with a lower end of the vertical shaft 5, and a lower face thereof is dotted with a number of nozzles 11. Chemicals "s" flowing in the hollow 10a through the liquid passage 5a are jetted from the nozzles 11 in a downward vertical direction. In this case, the jetting pattern of the nozzle 11 may be electively fan-shaped, doughnut-shaped, curtain-shaped, etc.

The above-mentioned device of the present invention carries out an etching process of a printed board as follows. After actuating the roller conveyer device 1, a printed board "w" to which copper foil "c" (FIG. 2) adheres is put on the rubber rollers 4, and the printed board "w" is gradually conveyed in an arrow direction "fl" (FIG. 1b) in a horizontal posture.

On the other hand, the motor 7 is actuated so as to rotate the vertical shaft 5 and the disk 10, and chemicals "s" are provided in the liquid passage 5a from the outside. By this, chemicals "s" are jetted in a downward vertical direction from the nozzles 11 rotating along the vertical shaft 5.

When the printed board "w" comes under the disk 10, chemicals "s" jetted from the nozzles 11 collide with an upper surface of the copper foil "c" and corrode the surface except wiring parts which are drawn thereon. In this case, since chemicals "s" are jetted in a downward vertical direction, a vertical wall "a" formed by corrosion of the surface of copper foil "c" is made in an accurate vertical shape without unnecessary furrows, as shown in FIG. 2. In addition, the rotating direction of the nozzles 11 for the printed board "w" becomes opposite in the front and back of the printed board travelling direction on the roller conveyer device 1, thereby effecting equal and minute etching. Furthermore, since the disk 10 is rotating, chemicals "s" are smoothly removed from the printed board "w" to the outside. Accordingly, the printed board "w" is finished uniformly, and the quality is increased.

Although the efficacy of the etching process, etc. may be heightened by lowering the conveying speed of the roller conveyer device 1, generally the rotating speed of the motor 7 is increased so as to speed up the rotation of the disk 10. In this method, the travelling speed of the nozzle 11 goes up, and the amount of chemicals "s" jetted to the printed board "w" per hour increases. Therefore, the efficacy of the process is heightened without reducing the feeding speed of the roller conveyer device 1.

The device of this invention is effectively used for developing and peeling processes as well as etching processes of the printed board "w".

It will be apparent to those skilled in the art and it is contemplated that variations and/or changes in the embodiment illustrated and described herein may be made without departure from the present invention. Accordingly, it is intended that the foregoing description is illustrative only, not limiting, and that the true spirit and scope of the present invention will be determined by the appended claims.

I claim:

1. An etching, developing and peeling apparatus for a printed board, the apparatus being provided a fixed height above a conveyor device having a plurality of juxtaposed shafts and rubber rollers ranked on each shaft at suitable intervals in a lengthwise direction thereof, said shafts being rotated in the same direction by means of a suitable driving mechanism so as to carry a printed board in a horizontal posture thereon, said etching, developing and peeling apparatus comprising a horizontal disk having a center part fixed with a lower end of a vertical shaft driven and rotated at an elected speed, and nozzles for jetting chemicals in a downward vertical direction arranged in plural concentric circles on a lower face of the disk, around the center of the disk, the number of the nozzles in a concentric circle increasing from an inner concentric circle to an outer concentric circle, and some of the nozzles of a concentric circle being positioned between nozzles on an inner adjacent one of the concentric circles.

2. An etching, developing and peeling apparatus for a printed board, comprising:

means for supporting the printed board in a horizontal orientation;

means for jetting chemicals in a downward vertical direction onto the printed board, said means for jetting chemicals comprising a horizontal disk having a lower face, an arrangement of nozzles on said lower face, and means for rotating said disk around a vertical axis at an elected speed, wherein said lower face has a center, and said nozzles are arranged in plural concentric circles around the center of said lower face, the number of the nozzles in a concentric circle increasing from an inner concentric circle to an outer concentric circle, and some of the nozzles of one of the concentric circles being positioned between nozzles on an inner adjacent one of the concentric circles.

* * * * *